(12) United States Patent  (10) Patent No.: US 6,721,185 B2
Dong et al.  (45) Date of Patent: Apr. 13, 2004

(54) MEMORY MODULE HAVING BALANCED DATA I/O CONTACTS PADS

(75) Inventors: Lam S. Dong, Berkeley, CA (US); Drew G. Doblar, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/846,873

(22) Filed: May 1, 2001

(65) Prior Publication Data

US 2002/0163784 A1 Nov. 7, 2002

(51) Int. Cl.$^7$ .............................. H05K 1/00; H05K 7/02; G11C 5/06; H01R 12/04
(52) U.S. Cl. ................. 361/736; 361/760; 174/260; 365/51; 439/60
(58) Field of Search ................... 361/736, 737, 361/748, 764, 780, 794, 795, 822, 777, 788; 174/250, 253, 255, 260, 261; 365/51; 439/50, 59, 60–61, 68, 70, 72, 108, 92

(56) References Cited

U.S. PATENT DOCUMENTS

| | | | |
|---|---|---|---|
| 4,790,447 A | | 12/1988 | Laudon et al. |
| 4,975,084 A | | 12/1990 | Fedder et al. |
| 5,272,664 A | * | 12/1993 | Alexander et al. ........... 365/52 |
| 5,339,269 A | | 8/1994 | Takagi |
| 5,513,135 A | * | 4/1996 | Dell et al. .................... 365/52 |
| 5,532,954 A | | 7/1996 | Bechtolsheim et al. |
| 5,829,036 A | | 10/1998 | Klein |
| 5,961,660 A | | 10/1999 | Capps, Jr. et al. |
| 6,097,883 A | * | 8/2000 | Dell et al. ................... 395/282 |
| 6,111,757 A | * | 8/2000 | Dell et al. ................... 361/737 |
| 6,115,278 A | * | 9/2000 | Deneroff et al. .............. 365/52 |
| 6,347,039 B1 | | 2/2002 | Lee |
| 6,353,539 B1 | * | 3/2002 | Horine et al. ................ 361/736 |
| 6,414,868 B1 | | 7/2002 | Wong et al. |
| 6,457,155 B1 | | 9/2002 | Dell et al. |

FOREIGN PATENT DOCUMENTS

EP 0744748 11/1996

OTHER PUBLICATIONS

"JC–42 5A Task Group Meeting Minutes", San Jose, CA, Jan. 18, 1994.
"$2^{nd}$ Generation SODIMM Discussion JEDEC Task Force Meeting in San Jose", Hiatachi America, Ltd., Jan. 18, 1995.

* cited by examiner

Primary Examiner—Randy Gibson
Assistant Examiner—Dameon E. Levi
(74) Attorney, Agent, or Firm—Meyertons Hood Kivlin Kowert & Goetzel, P.C.; B. Noël Kivlin

(57) ABSTRACT

A memory module having balanced data input/output contacts. A memory module includes a printed circuit board having an edge connector and a plurality of memory integrated circuits. The edge connector may be adapted for insertion into a socket of a motherboard of a computer system, for example. The edge connector includes a plurality of contact pads on both sides of the printed circuit board. The contact pads are configured to convey data signals, power and ground to and from the printed circuit board. The power and ground contact pads alternate along the edge connector. There are no more than four data signal contact pads without intervening power or ground contact pads.

13 Claims, 4 Drawing Sheets

Memory Module Pad Assignment 400

| Pad No. | Pad Name | Pad No. | Pad Name | Pad No. | Pad Name | Pad No. | Pad Name | Pad No. | Pad Name |
|---|---|---|---|---|---|---|---|---|---|
| 1 | VSS | 48 | A1 | 95 | VSS | 142 | VDD | 189 | DQ78 |
| 2 | DQ0 | 49 | A2 | 96 | DQ112 | 143 | DQ44 | 190 | DQ79 |
| 3 | DQ1 | 50 | A3 | 97 | DQ113 | 144 | DQ45 | 191 | VSS |
| 4 | DQ2 | 51 | VSS | 98 | DQ114 | 145 | DQ46 | 192 | DQ84 |
| 5 | DQ3 | 52 | A8 | 99 | DQ115 | 146 | DQ47 | 193 | DQ85 |
| 6 | VDD | 53 | A9 | 100 | VDD | 147 | VSS | 194 | DQ86 |
| 7 | DQ8 | 54 | A10 | 101 | DQ120 | 148 | DQ52 | 195 | DQ87 |
| 8 | DQ9 | 55 | VDD | 102 | DQ121 | 149 | DQ53 | 196 | VDD |
| 9 | DQ10 | 56 | RAS0\ | 103 | DQ122 | 150 | DQ54 | 197 | DQ92 |
| 10 | DQ11 | 57 | WE0\ | 104 | DQ123 | 151 | DQ55 | 198 | DQ93 |
| 11 | VSS | 58 | VSS | 105 | VSS | 152 | VDD | 199 | DQ94 |
| 12 | DQ16 | 59 | RAS1\ | 106 | DQ128 | 153 | DQ60 | 200 | DQ95 |
| 13 | DQ17 | 60 | OE0\ | 107 | DQ129 | 154 | DQ61 | 201 | VSS |
| 14 | DQ18 | 61 | VSS | 108 | DQ130 | 155 | DQ62 | 202 | DQ100 |
| 15 | DQ19 | 62 | CLK+ | 109 | DQ131 | 156 | DQ63 | 203 | DQ101 |
| 16 | VDD | 63 | CLK- | 110 | VDD | 157 | VSS | 204 | DQ102 |
| 17 | DQ24 | 64 | VSS | 111 | DQ136 | 158 | DQ68 | 205 | DQ103 |
| 18 | DQ25 | 65 | CS0 | 112 | DQ137 | 159 | DQ69 | 206 | VDD |
| 19 | DQ26 | 66 | SA0 | 113 | DQ138 | 160 | DQ70 | 207 | DQ108 |
| 20 | DQ27 | 67 | SA1 | 114 | DQ139 | 161 | DQ71 | 208 | DQ109 |
| 21 | VSS | 68 | SA2 | 115 | NC | 162 | VDD | 209 | DQ110 |
| 22 | DQ32 | 69 | VDD | 116 | VSS | 163 | A4 | 210 | DQ111 |
| 23 | DQ33 | 70 | A14 | 117 | VSS | 164 | A5 | 211 | VSS |
| 24 | DQ34 | 71 | DQ72 | 118 | DQ4 | 165 | A6 | 212 | DQ116 |
| 25 | DQ35 | 72 | DQ73 | 119 | DQ5 | 166 | A7 | 213 | DQ117 |
| 26 | VDD | 73 | DQ74 | 120 | DQ6 | 167 | VSS | 214 | DQ118 |
| 27 | DQ40 | 74 | DQ75 | 121 | DQ7 | 168 | A11 | 215 | DQ119 |
| 28 | DQ41 | 75 | VSS | 122 | VDD | 169 | A12 | 216 | VDD |
| 29 | DQ42 | 76 | DQ80 | 123 | DQ12 | 170 | A13 | 217 | DQ124 |
| 30 | DQ43 | 77 | DQ81 | 124 | DQ13 | 171 | VDD | 218 | DQ125 |
| 31 | VSS | 78 | DQ82 | 125 | DQ14 | 172 | CAS0\ | 219 | DQ126 |
| 32 | DQ48 | 79 | DQ83 | 126 | DQ15 | 173 | WE1\ | 220 | DQ127 |
| 33 | DQ49 | 80 | VDD | 127 | VSS | 174 | VSS | 221 | VSS |
| 34 | DQ50 | 81 | DQ88 | 128 | DQ20 | 175 | CAS1\ | 222 | DQ132 |
| 35 | DQ51 | 82 | DQ89 | 129 | DQ21 | 176 | OE1\ | 223 | DQ133 |
| 36 | VDD | 83 | DQ90 | 130 | DQ22 | 177 | VSS | 224 | DQ134 |
| 37 | DQ56 | 84 | DQ91 | 131 | DQ23 | 178 | CLKE0 | 225 | DQ135 |
| 38 | DQ57 | 85 | VSS | 132 | VDD | 179 | CLKE1 | 226 | VDD |
| 38 | DQ58 | 86 | DQ96 | 133 | DQ28 | 180 | DQM0 | 227 | DQ140 |
| 40 | DQ59 | 87 | DQ97 | 134 | DQ29 | 181 | DQM1 | 228 | DQ141 |
| 41 | VSS | 88 | DQ98 | 135 | DQ30 | 182 | CS1 | 229 | DQ142 |
| 42 | DQ64 | 89 | DQ99 | 136 | DQ31 | 183 | SCLK | 230 | DQ143 |
| 43 | DQ65 | 90 | VDD | 137 | VSS | 184 | SDA | 231 | NC |
| 44 | DQ66 | 91 | DQ104 | 138 | DQ36 | 185 | VDD | 232 | VSS |
| 45 | DQ67 | 92 | DQ105 | 139 | DQ37 | 186 | A15 | | |
| 46 | VDD | 93 | DQ106 | 140 | DQ38 | 187 | DQ76 | | |
| 47 | A0 | 94 | DQ107 | 141 | DQ39 | 188 | DQ77 | | |

FIG. 4

MEMORY MODULE HAVING BALANCED DATA I/O CONTACTS PADS

BACKGROUND OF THE INVENTION

1. Field of the Invention

This invention relates to memory subsystems and, more particularly, to contact pad arrangement on memory modules.

2. Description of the Related Art

The demand for performance in computer systems is continually increasing. There are many methods of increasing the performance of a computer system. One method for increasing performance is to increase the size of the memory. This is true for all levels within the memory hierarchy, including registers (within a microprocessor core), cache memory, main memory, and disk storage. In many cases, an increase in the size the main memory will result in a significant performance gain by a computer system.

Another method of increasing the performance of a computer system may be to increase the clock speed of the microprocessor and associated system buses. Other methods of increasing the speed of computer systems involve architectural changes, which may be implemented in the design phase of a computer system. One such architectural change is to increase the size of the data bus. Increasing the size of the data bus may allow computers to process more information per clock cycle than computers with smaller data buses. For example, a computer with a 32-bit data bus may be able to process twice as much information per clock cycle as a computer with a 16-bit data bus.

Although increasing the size of the data bus and the clock speed of a computer system are two methods of obtaining higher performance, these methods may have an adverse impact on the performance of memory modules. Memory modules have been used for some time as a computer's main memory, since their modularity may make memory reconfiguration easier. Memory modules may also make removing and replacing faulty memory segments easier.

Memory modules are typically implemented using small circuit boards with limited area for signal traces and contact pads. Implementing a larger data bus can present significant difficulties in designing a circuit board for a memory module intended for such computer systems. In addition to traces and contact pads for the data bus, area must be reserved for traces and contact pads necessary to convey address and control signals to the chips on the module, as well as for power and ground connections. Thus, as more traces and contact pads are added to a given circuit board, the closer the traces and contact pads may be placed to each other. As traces and contact pads are moved closer together signal integrity may be compromised due to inter-electrode capacitance and other proximity related interference. This type of interference is sometimes referred to as "cross-talk." Such cross-talk may induce errors into signal lines on a memory module or computer motherboard.

Increasing the clock speed of a computer system may further increase interference problems caused by signal traces and contact pads that are close together. Typically, as the speed of operation increases, the potential for cross-talk between the various signals may also increase. In some cases, an error correction subsystem may be able to correct these errors. However, typical error correction subsystems are limited in the number of simultaneous errors they may detect and/or correct. Uncorrected errors may often times lead to undesirable operation of a computer system. Memory modules operating at higher clock speeds with large data bus widths may be especially susceptible to errors induced by cross-talk.

SUMMARY OF THE INVENTION

Various embodiments of a memory module having balanced data input and output contacts are disclosed. In one embodiment, a memory module includes a printed circuit board having an edge connector and a plurality of memory integrated circuits. The edge connector may be adapted for insertion into a socket of a motherboard of a computer system, for example. The edge connector includes a plurality of contact pads on both sides of the printed circuit board. The contact pads are configured to convey data signals, power and ground to and from the printed circuit board. The power and ground contact pads alternate along the edge connector. There are no more than four data signal contact pads without intervening power or ground contact pads.

In one particular implementation, the memory integrated circuits (ICs) are synchronous dynamic random access memories (SDRAM). In another implementation, the memory ICs are dynamic random access memories (DRAM).

In other implementations, the memory ICs are arranged on the printed circuit board to minimize the trace length between a particular memory chip and corresponding contact pads associated with the particular memory chip.

BRIEF DESCRIPTION OF THE DRAWINGS

FIG. 4 is a pad assignment table for one embodiment of a memory module.

Figure 1:
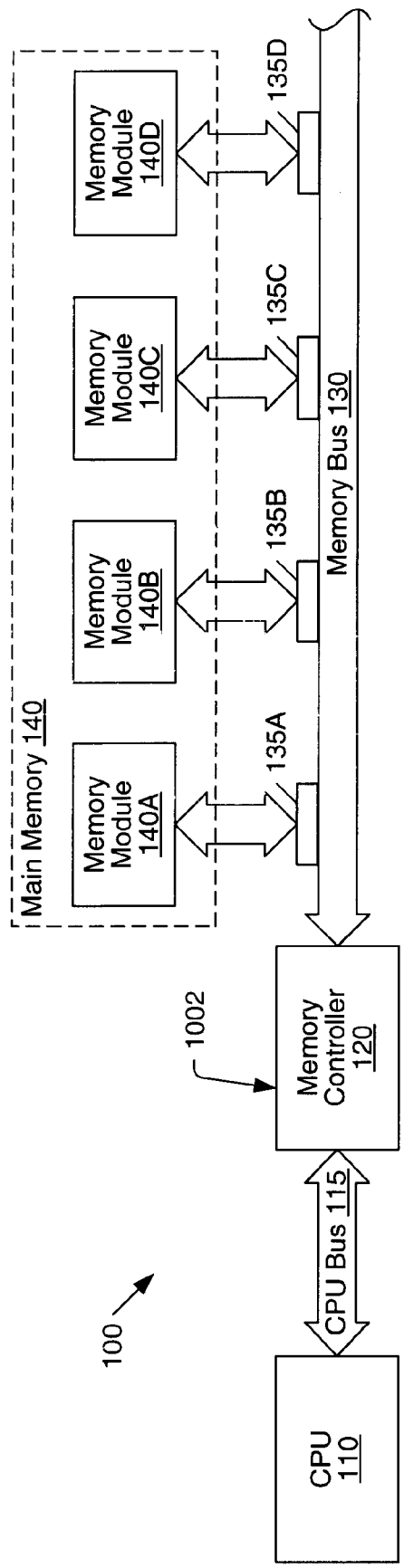
FIG. 1 is a block diagram of one embodiment of a computer system including a plurality of memory modules.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to FIG. 1, a block diagram of one embodiment of a computer system including a plurality of memory modules is shown. Computer system 100 includes a central processing unit (CPU) 110 coupled to a memory controller 120 through a CPU bus 115. Computer system 100 further includes a main memory 140 coupled to memory controller 120 through a memory bus 130. Memory bus 130 includes connector sockets 135A–135D.

In the illustrated embodiment, main memory 140 is implemented using memory modules 140A–140D which are connected to memory bus 130 through connector sockets 135A–135D. As will be described further below in conjunction with FIG. 2, an edge connector associated with each of the memory modules may be mated with each one of the connector sockets. When inserted into a connector socket 135, a memory module such as memory module 140A may provide computer system 100 with a main memory. If more memory capacity is desired, additional memory modules may be inserted into unoccupied connector sockets. Although main memory 140 is shown with four memory modules, it is noted that main memory 140 may be implemented using any suitable number of memory modules depending on the particular system implementation.

Figure 2:
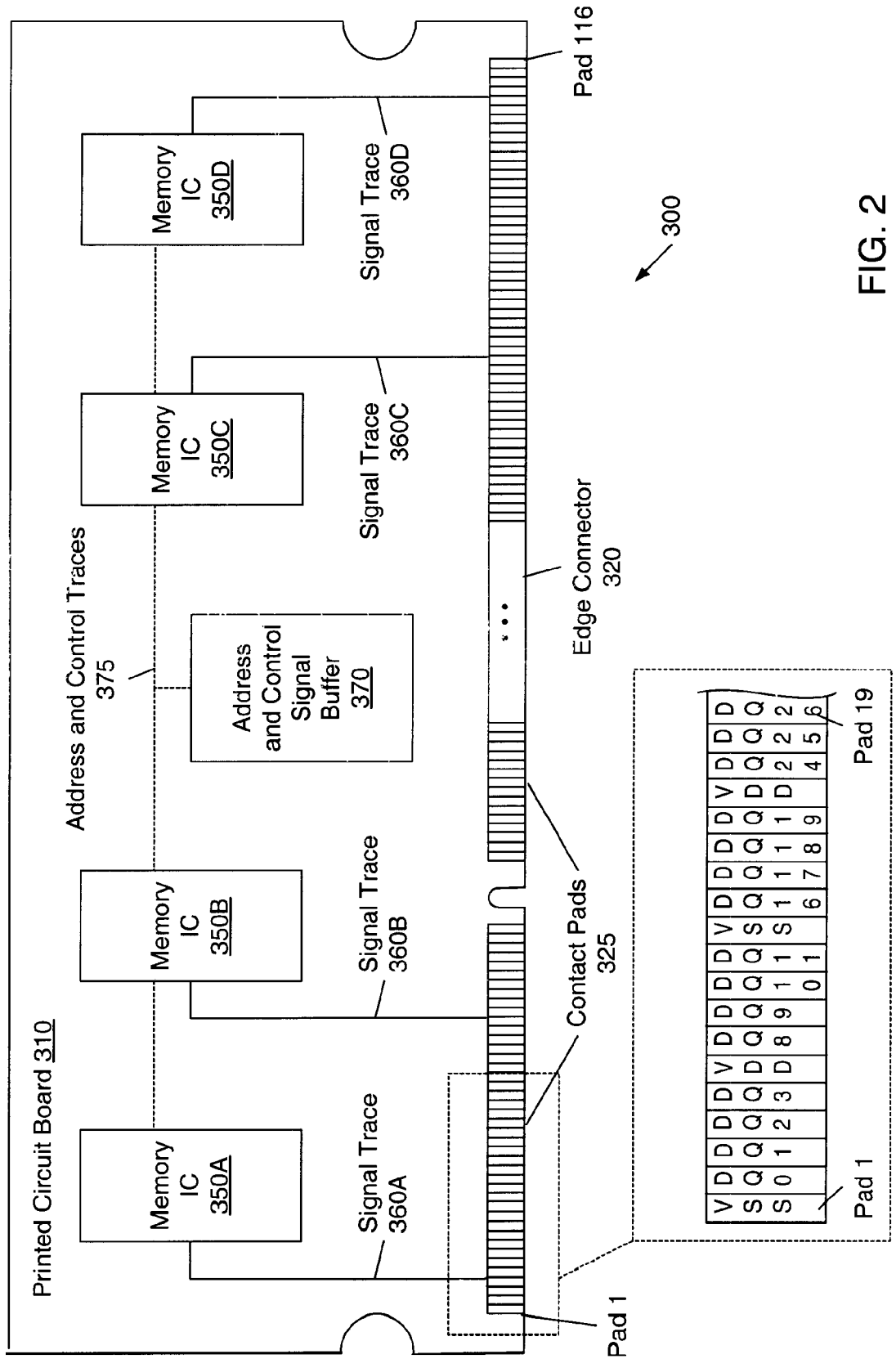
FIG. 2 is a drawing of one embodiment of a memory module.

Referring to FIG. 2, a drawing of one embodiment of a memory module is shown. Memory module 300 includes memory integrated circuits (ICs) or memory chips 350A–350D which may be mounted to a printed circuit board (PCB) 310 using a variety of techniques such as surface mounting, for example. PCB 310 is a circuit board including various signal traces 360A–360D that couple memory ICs 350A–350D to an edge connector 320 containing contact pads 325. Memory module 300 also includes one or more address and control signal buffer IC 370. It is noted that in other embodiments, memory module 300 may not include address and control signal buffers. It is further noted that other embodiments may include other integrated circuit chips that may include additional control functionality as well as memory module configuration information.

Signal traces 360A–360D convey signals such as data, address and control information as well as power and ground between edge connector 320 and memory ICs 350A–350D. Contact pads 325 make physical contact with various types of contacts on a mating connector socket similar to connector socket 135A in FIG. 1. In one embodiment, PCB 310 of FIG. 2 is a multi-layered circuit board which includes signal traces 360A–360D on some layers and power and ground planes on other layers.

Figure 3:
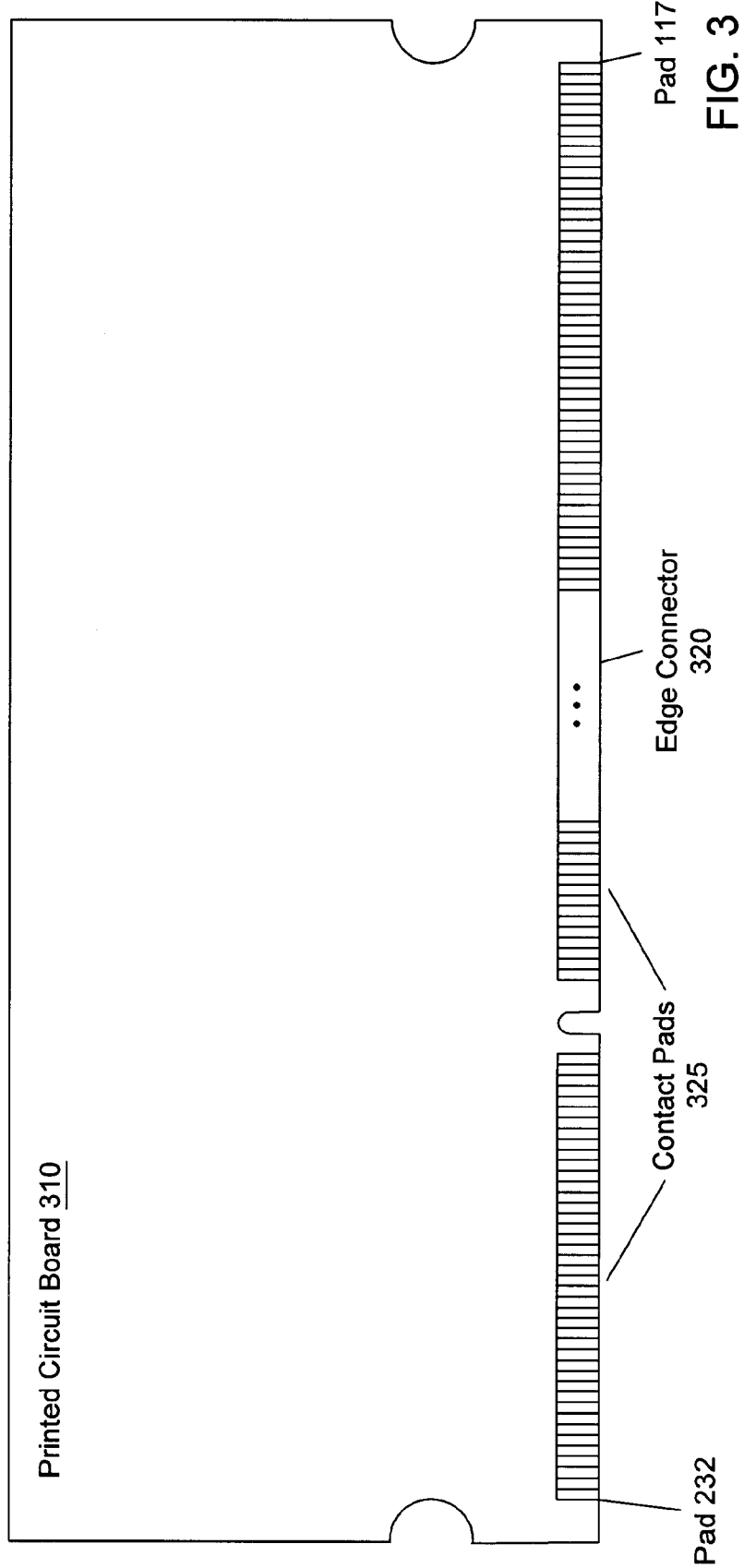
FIG. 3 is a drawing of one embodiment of the opposing side of the memory module of FIG. 2.

In the illustrated embodiment, contact pads numbered 1 through 116 are shown on one side of PCB 310. Edge connector 320 contains 232 contact pads. FIG. 3 illustrates the numbering of contact pads 117 through 232 on the opposite side of PCB 310. Contact pad number 117 is opposite contact pad number 1 and contact pad 232 is opposite contact pad 116. Contact pads 325 are sequentially numbered and distributed along the length of edge connector 320 on each side of PCB 310. Contact pads 325 allow various address, data and control signals in addition to power and ground, to pass between PCB 310 and a memory bus such as memory bus 130 of FIG. 1. It is noted that although edge connector 320 is shown with 232 contact pads, it is contemplated that in other embodiments edge connector 320 may have other numbers of contact pads.

As will be described in greater detail below in conjunction with the description of FIG. 4, the exploded view of FIG. 2 illustrates a small portion of edge connector 320 on the front side of PCB 310.

Turning now to FIG. 4, a pad assignment table for one embodiment of a memory module is shown. Memory module pad assignment table 400 is an exemplary diagram illustrating the numbering of the contact pads and the signals assigned to the corresponding pad numbers associated with edge connector 320 of FIG. 2. Pad assignment table 400 includes multiple rows and columns. The columns are labeled Pad Number and Pad Name. Therefore, each pad number has a corresponding pad name associated with it. For example, Pad number 1 is referenced as VSS. Pad number 2 is referenced DQ0 and so forth. In this particular embodiment, the ground pads are referenced VSS and the power pads are referenced VDD. Further, the data signal pad names are DQ0–DQ143.

Referring collectively to FIG. 2 through FIG. 4, power and ground contact pads are distributed along the length of edge connector 320 in an alternating pattern forming adjacent VSS-VDD contact pad pairs. To illustrate, refer back to the exploded view of edge connector 320 in FIG. 2. Contact pad 1 is a ground contact pad while contact pad 6 is a power contact pad. Further, contact pad 11 is also a ground contact pad and contact pad 16 is a power contact pad. This alternating pattern may continue along the entirety of edge connector 320. As used herein, an adjacent power and ground contact pad pair refers to any particular pair of power and ground contact pads that have no other power or ground contact pads between the particular pair of power and ground contact pads. For example, contact pad 6 and contact pad 1 are an adjacent power and ground contact pad pair. Additionally, contact pad 6 and contact pad 11 are an adjacent power and ground contact pad pair. In contrast, contact pad 1 and contact pad 16 are not an adjacent power and ground contact pad pair because contact pad 11 is an intervening ground contact pad.

Referring again to pad assignment table 400, it is noted that there are no more than four data signal contact pads between any adjacent VSS-VDD contact pad pair (e.g., pads DQ0–DQ3 are between pads 1 and 6). Although in some embodiments, there may be less than four data signal contact pads between any adjacent VSS-VDD contact pad pair.

In the illustrated embodiment, there are more than four contact pads between some adjacent VSS-VDD contact pad pairs, but there are not more than four data signal contact pads. For example, between the VSS-VDD contact pad pair formed by pads 110 and 116, there are five contact pads. However, one pad (pad 115) is designated as a no-connect and thus referenced as NC. In another example, there are multiple non-data signal contact pads between the VSS-VDD contact pad pair formed by pads 177 and 185, but that there are still no more than four data signal between any adjacent VSS-VDD contact pad pair.

Evenly distributing the data signal contact pads between adjacent power and ground contact pad pairs may improve data signal integrity by reducing the signal return path length associated with a particular data signal. Further, by separating the power and ground contact pads power to ground short circuits may be minimized.

Numerous variations and modifications will become apparent to those skilled in the art once the above disclosure is fully appreciated. It is intended that the following claims be interpreted to embrace all such variations and modifications.

What is claimed is:

1. A memory module for memory expansion in a computer system, said memory module comprising:

a printed circuit board having a first side and a second side, wherein said printed circuit board includes a connector edge adapted for insertion within a socket of said computer system, the connector edge having a plurality of contact pads on said first side and said second side of said printed circuit and a plurality of memory chips mounted on said printed circuit board;

wherein said plurality of contact pads includes power contact pads configured to convey power, ground contact pads configured to convey ground and data signal contact pads configured to convey data bits for storage within said plurality of memory chips;

wherein said power and ground contact pads alternate along each side of said connector edge, wherein at least one of said ground contact pads is between every two of said power contact pads to form adjacent power and ground contact pad pairs; and wherein all of said data signal contact pads are arranged between given adjacent power and ground contact pad pairs such that exactly four of said data signal contact pads are arranged between any of said given adjacent power and ground contact pad pairs.

2. The memory module as recited in claim 1, wherein said memory chips are synchronous dynamic random access memory (SDRAM) integrated circuits.

3. The memory module as recited in claim 1, wherein said memory chips are dynamic random access memory (DRAM) integrated circuits.

4. The memory module as recited in claim 1, wherein said plurality of memory chips are arranged on said printed circuit board to minimize the trace length between a particular memory chip and corresponding contact pads associated with said particular memory chip.

5. A computer system comprising:

a processor;

a memory controller coupled to said processor through a system bus;

a memory bus coupled to said memory controller;

a main memory subsystem coupled to said memory bus, said main memory subsystem comprising:

at least one memory module coupled to said memory bus, wherein said at least one memory module includes:

a printed circuit board having a first side and a second side, wherein said printed circuit board includes a connector edge adapted for insertion within a socket of said computer system, the connector edge having a plurality of contact pads on said first side and said second side of said printed circuit board; and a plurality of memory chips mounted on said printed circuit board;

wherein said plurality of contact pads includes power contact pads configured to convey power, ground contact pads configured to convey ground and data signal contact pads configured to convey data bits for storage within said plurality of memory chips;

wherein said power and ground contact pads alternate along each side of said connector edge, wherein at least one of said ground contact pads is between every two of said power contact pads to form adjacent power and ground contact pad pairs; and wherein all of said data signal contact pads are arranged between given adjacent power and ground contact pad pairs such that exactly four of said data signal contact pads are arranged between any of said given adjacent power and ground contact pad pairs.

6. The computer system as recited in claim 5, wherein said memory chips are synchronous dynamic random access memory (SDRAM) integrated circuits.

7. The computer system as recited in claim 5, wherein said memory chips are dynamic random access memory (DRAM) integrated circuits.

8. The computer system as recited in claim 5, wherein said plurality of memory chips are arranged on said printed circuit board to minimize the trace length between a particular memory chip and corresponding contact pads associated with said particular memory chip.

9. A memory module for memory expansion in a computer system, the memory module comprising:

a printed circuit board having a first side and a second side, wherein said printed circuit board includes a connector edge adapted for insertion within a socket of said computer system, the connector edge having a plurality of contact pads on said first side and said second side of said printed circuit board; and a plurality of memory chips mounted on said printed circuit board;

wherein said plurality of contact pads includes evenly spaced power and ground contact pads in an alternating arrangement and data signal contact pads configured to convey data bits for storage within said plurality of memory chips;

wherein at least one of said ground contact pads separates every two of said power contact pads; and wherein all of said data signal contact pads are arranged between given pairs of power and ground contact pads that have no other intervening power or ground contact pads such that exactly four of said data signal contact pads are arranged between any of said given pairs of power and ground contact pads.

10. The memory module as recited in claim 9, wherein said memory chips are synchronous dynamic random access memory (SDRAM) integrated circuits.

11. The memory module as recited in claim 9, wherein said memory chips are dynamic random access memory (DRAM) integrated circuits.

12. The memory module as recited in claim 9, wherein said plurality of memory chips are arranged on said printed circuit board to minimize the trace length between a particular memory chip and corresponding contact pads associated with said particular memory chip.

13. A memory module for memory expansion in a computer system, said memory module comprising:

a printed circuit board having a first side and a second side, wherein said printed circuit board includes a connector edge adapted for insertion within a socket of said computer system, the connector edge having a plurality of contact pads on said first side and said second side of said printed circuit board; and a plurality of memory chips mounted on said printed circuit board;

wherein said plurality of contact pads includes power contact pads configured to convey power, ground contact pads configured to convey ground and data signal contact pads configured to convey data bits for storage within said plurality of memory chips;

wherein said power and ground contact pads alternate along each side of said connector edge, wherein at least one of said ground contact pads is between every two of said power contact pads to form adjacent power and ground contact pad pairs; and wherein all data signal contact pads of said connector edge are arranged such that for any adjacent power and ground contact pad pair that includes an intervening data contact pad, exactly four of said data signal contact pads are provided therebetween.

* * * * *